United States Patent [19]

Griffin et al.

[11] 4,283,100

[45] Aug. 11, 1981

[54] JUMPER PLUG

[75] Inventors: Rodney B. Griffin; William A. Swenson, both of Aurora, Ill.

[73] Assignee: Western Electric Company, Inc., New York, N.Y.

[21] Appl. No.: 107,758

[22] Filed: Dec. 27, 1979

[51] Int. Cl.³ .......................................... H01R 31/08
[52] U.S. Cl. .................................. 339/19; 339/59 R; 339/222; 361/426
[58] Field of Search ................ 339/19, 59, 59 M, 222; 361/367, 352, 426

[56] References Cited

U.S. PATENT DOCUMENTS

| 2,295,757 | 9/1942 | Russell | 339/222 X |
| 2,671,204 | 3/1954 | Hubbell | 339/59 R |
| 4,108,522 | 8/1978 | Favale | 339/19 |

FOREIGN PATENT DOCUMENTS 2644779  4/1977  Fed. Rep. of Germany ........ 339/59 M

OTHER PUBLICATIONS

Berg/Products Data Bulletin 144, Berg Electronics.
Bulletin "Sealectro Jump Jax" Sealectro Corp.

Primary Examiner—Howard N. Goldberg
Assistant Examiner—Frank H. McKenzie, Jr.
Attorney, Agent, or Firm—J. J. Jordan; J. L. Landis

[57] ABSTRACT

A jumper plug (11) for making an electrical connection between two terminal pins (15) has a housing (12) containing two holes (13–14) for accepting the pins. Mounted in the housing is a horseshoe-shaped spring clip (30), made of an electrically conductive material, having each of its legs (31) extending down into a hole such that as the pins (15) are inserted into the holes they come into contact with the legs. Additionally, the walls (17, 18, 19, 20) of the holes are tapered to insure a better contact between the inserted pins (15) and the legs (31).

2 Claims, 3 Drawing Figures

JUMPER PLUG

TECHNICAL FIELD

This application relates generally to connectors for making electrical connections. More specifically the invention concerns a jumper plug for making a connection between two terminal pins located on a back plane or on a circuit board.

BACKGROUND OF THE INVENTION

It is often desirable to make an electrical connection or "jump" between adjacent terminal pins located on a printed wiring board or on a back plane of a piece of electrical equipment. Typically, the terminal pins are clustered together on 0.100" (0.254 cm) centers in high density arrangements which makes direct wiring on the two selected terminal pins difficult to achieve.

There presently exists connectors, called jumper plugs, specifically designed to make connections between two adjacent terminal pins by pressing the plug down onto the pins. Typical of these jumper plugs are the JUMP-JAX plug manufactured by the Sealectro Corporation of Mamaroneck, New York, and the Berg PV TM Jumper System manufactured by Berg Electronics of New Cumberland, Pennsylvania. However, both of these plugs contain intricate metal connector arrangements, either a copper ring or rectangular-shaped receptacles mounted within the plug housing, to achieve secure cross connection or jump connection between terminal pins. Because of these connector arrangements the plugs are more difficult to manufacture and, therefore, more costly to produce.

Specific objects of the present invention are to provide a low cost, easy to manufacture jumper plug having a simple metal cross connection arrangement capable of making a secure electrical cross connection between two adjacent terminal pins.

SUMMARY OF THE INVENTION

With the foregoing and other objects in view, the invention relates to a jumper plug for making a secure electrical connection between two terminal pins comprising an insulating body having two holes arranged to accept the two terminal pins. Inserted into each of the holes is a leg of a horseshoe-shaped metal spring clip which clip is retained in place such that as the pins are pushed into the holes, each resilient leg of the clip comes into contact with a pin whereby the metal spring clip provides a secure electrical connection between the inserted pins. In accordance with certain features of the invention, the plug further comprises a channel located in the insulating body as a means for retaining the horseshoe-shaped clip. The upper edge of the channel is a tapered tab which permits the clip to be easily assembled into the plug by sliding the center portion of the horeshoe-shaped clip over the tab and into the channel.

An additional feature of the invention is that the walls of the holes are tapered to force the inserted terminal pins into a more secure contact with the legs of the spring clip.

Other objects, specific advantages and features of the invention will be apparent from the following detailed description of the specific example and embodiments thereof, when used in conjunction with the accompanying drawings.

DETAILED DESCRIPTION

Figure 1:
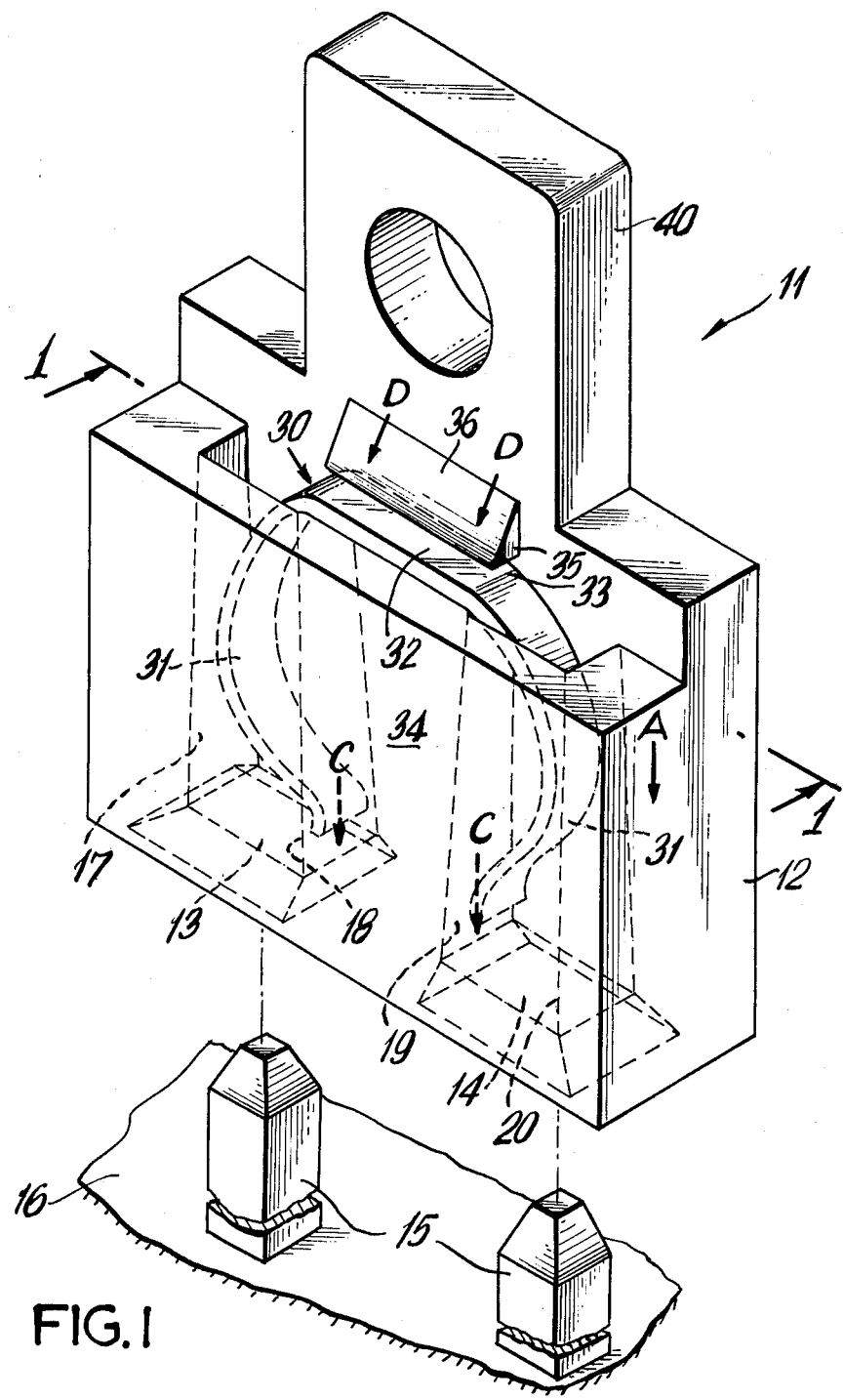
FIG. 1 is a perspective view of the jumper plug, with dashed lines showing the arrangement of the horseshoe-shaped clip within the plug.
Figure 2:
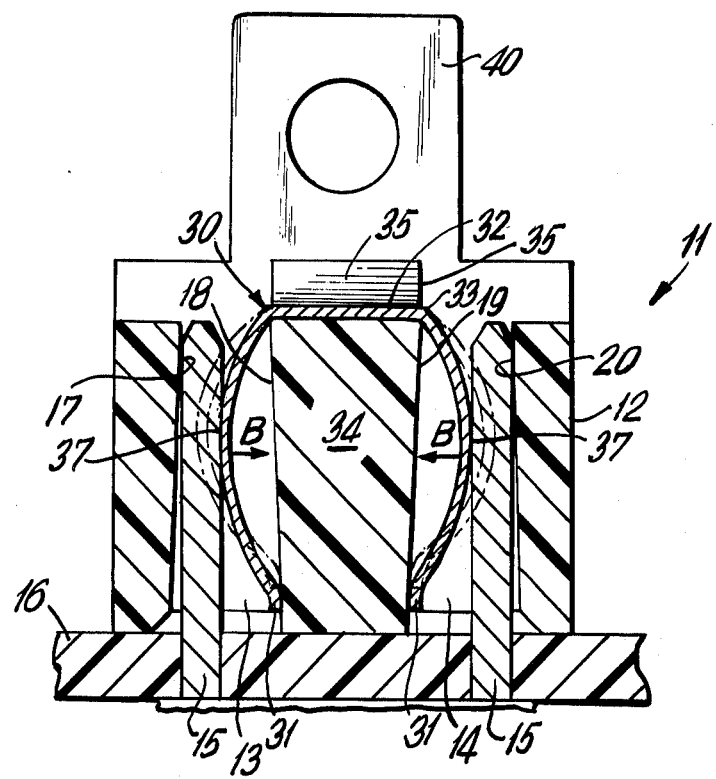
FIG. 2 is a vertical section of the plug shown in FIG. 1 along lines 1—1 of FIG. 1, illustrating the contact between the inserted terminal pins and the horseshoe-shaped clip.

A jumper plug which is simple to manufacture and utilizes the present invention is shown in FIGS. 1-2. Jumper plug 11 comprises a plastic molded body 12 having two holes 13 and 14 therein for receiving terminal pins 15 which are usually located on a back plane or on a printed wiring board 16. According to standard plug manufacturing practice, the entry of the holes 13-14 may be chamfered to facilitate insertion of the terminal pins.

The two holes 13-14 are rectangular in shape, are sufficiently long to house terminal pins 15, but have larger cross-sectional dimensions than the dimensions of the typical terminal pins with which they will cooperate. At the mouth of each hole 13-14, that is at the end of the hole which first receives the terminal pin, each hole is typically 0.075" (1.9 mm) wide by 0.040" (1.0 mm) long, while the typical terminal pin is 0.025" square or 0.025" (0.64 mm) diameter for rounded pins. The mouths are specifically designed with these larger dimensions to compensate for different sizes of terminal pins as well as for terminal pins which may be mounted off-center. As described below in detail, the present jumper plug is specifically designed to make secure electrical and mechanical contact with terminal pins even when the terminal pins are mounted off-center.

In a typical arrangement of the plug as shown in FIG. 2, the walls 17-18 and 19-20 of each hole are shaped such that the holes 13-14 are inwardly tapered from the mouth to the upper end of each hole. The tapered walls 17-18 and 19-20 aid in the mechanical and electrical contact between the plug and the terminal pins as is described in further detail below.

Plug 11 also comprises an electrically conductive horseshoe-shaped spring clip 30 having a pair of resilient legs 31 connected by a center or heel portion 32. As seen in FIGS. 1 and 2 each leg 31 of the clip initially projects outward into a respective hole 13-14 towards an outer wall 17, 20 and then extends down into the hole before curving back toward an inner wall 18, 19 near the mouth of each hole. The end of each leg 31 rests on the inner wall 18, 19 in such a manner that, as the resilient leg 31 of the spring clip 30 is forced toward the inner wall, the end can move down the wall, (in the direction of arrows C, FIG. 1), without exiting from the mouth of the hole. Each leg 31 is thus located in its respective hole such that the leg is contained in the hole by the inner and outer walls thereby making it impossible for a pin to be inserted into the hole without coming into physical contact with the contained leg 31.

Horseshoe clip 30 is preferably fabricated from a conductive spring metal, such as beryllium copper, so as to serve as an electrical as well as physical contact for terminal pins.

The center, or heel portion 32 of the clip 30 is housed in a channel or slot 33 extending along the upper portion of a core 34 which is between holes 13-14 of the plug. Slot 33 is formed by core 34, body 12 and a tab 35 with the height of the slot being approximately the same as the height of the heel 32 of clip 30 as seen in FIGS. 1-2. Tab 35 has a sloped side 36 extending down and away from body 12 toward slot 33 with the bottom side of the tab forming the top side of slot 33. When inserted into slot 33, heel 32 of clip 30 is prevented from moving up out of slot 33 by tab 35.

When a plug 11 is placed over two adjacent terminal pins 15 such that the pins are aligned with holes 13-14 and the plug is pushed down onto the terminal pins in the direction of arrow A FIG. 1, the top of each pin 15 typically initially contacts outer walls 17 and 20 of each hole. As the plug is further pushed down, each pin 15 next comes into contact with a leg 31 of horseshoe-shaped clip 30 located in each hole 13-14 with each pin 15 being forced between a leg 31 and a respective outer wall 17-20 and legs 31 are now cammed inwardly toward core 34 (arrow B—B) thereby making a mechanical and electrical contact with each of the terminal pins 15.

As is evident from FIG. 2, the tapered walls 17 and 20 force the pins 15 into more secure contact with legs 31 as the plug 11 is further pushed down onto the pins. Thus even if the pins 15 are mounted off-center on circuit board 16, once they are located in holes 13-14, tapered walls 17 and 20 will divert the inserted pins into contact with the legs 31 of clip 30 as the plug 11 is pushed down on the pins. Additionally, as plug 11 is pushed down on the pins, heel 32 of clip 30 is forced against the bottom of tab 35 which prevents clip 30 from moving up away from the pins while also exerting a downward force on the legs 31. Resilient legs 31 of the horseshoe-shaped clip 30, the tapered walls of the body 12 and the forces exerted by tab 35 all cooperate to provide a desired fixed relationship, a secure electrical and mechanical contact between the legs 31 and the inserted pins 15. When pins 15 are fully inserted into plug 11, plug 11 is securely seated on the inserted terminal pins which are now electrically interconnected by clip 30.

Figure 3:
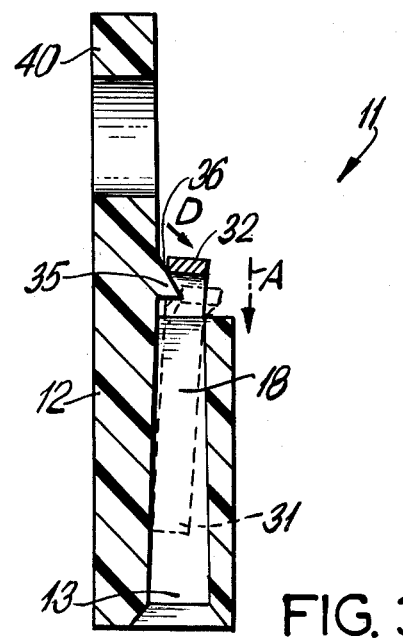
FIG. 3 is a section view looking from an end of the plug, illustrating the insertion of horseshoe-shaped clip into the plug.

The jumper plug 11 is simple and inexpensive to manufacture and assemble. The body 12 may be molded out of any of a number of common plastics such as for example polypropylene. The horseshoe-shaped clip 30 can be made from beryllium copper with gold electroplated onto portions 37 of the clip 30 where it comes into contact with inserted terminal pins, as shown in FIG. 2, in order to enhance electrical conductivity between the pins and the clip. The clip can be produced by any well known manufacturing processes such as punching the clip from a sheet or ribbon of beryllium copper and then electroplating the gold onto the formed clips. The plug itself is assembled by pushing each of the legs 31 of clip 30 into a corresponding hole until the center section 32 of clip 30 comes into contact with the sloped top portion 36 of tab 35 (FIG. 3). Clip 30 is now only partially inserted into plug 11 and by sliding the center section 32 down sloped portion 36 toward the holes 13-14 of the plug in the direction of arrows D, FIGS. 1 and 3, the legs are further inserted into holes 13-14 until the center section 32 reaches the end of the sloped portion of tab 35 and snaps into slot 33. Clip 30 is now firmly held in the body 12 of plug 11 and cannot be removed since the heel 32 of clip 30 is prevented from moving out of the plug by the bottom of tab 35 and the tapered walls of holes 13-14 also resist any upward movement of the fully inserted legs 31.

As seen in FIGS. 1-3, plug 11 can be manufactured with a handle 40 to permit easier insertion and withdrawal of the plug in areas having high density of terminal pins.

From the foregoing description it should be apparent that there is provided a low cost jumper plug 11 which is easy to manufacture and assemble and capable of providing secure electrical connections between two adjacent terminal pins.

While various specific examples and embodiments of the invention have been described in detail hereinabove, it should be obvious that various modifications may be made from the specific details without departing from the spirit and scope of the invention.

What is claimed is:

1. A jumper plug for making a secure electrical connection between two terminal pins comprising:
    an insulating body having two holes extending through the body arranged to accept the two terminal pins,
    a horseshoe-shaped electrically conductive resilient clip having each of its legs extending into a respective one of the holes to a sufficient length to make contact with a terminal pin inserted into the hole, and
    means for retaining the clip in the body comprising a channel in the body of the plug, the channel being of sufficient width to accept the portion of the horseshoe-shaped clip which extends between the legs of the clip, for holding the clip within the body when the terminal pins are inserted into the plug, and a tab defining the top of the channel, the tab having a sloped upper wall,
    so that, as the pins are inserted into the holes, the retaining means cooperate with the resilient clip to make a secure electrical connection between each of the inserted terminal pins and a respective leg of the clip.

2. A jumper plug as recited in claim 1 wherein the walls of the holes are tapered inwardly to force the inserted pins into contact with the legs.

* * * * *